(12) United States Patent
Maeda et al.

(10) Patent No.: US 7,431,624 B2
(45) Date of Patent: Oct. 7, 2008

(54) METHOD OF MANUFACTURING ORGANIC EL ELEMENT

(75) Inventors: Norihisa Maeda, Ishikawa-gun (JP); Hirofumi Kubota, Kanazawa (JP); Hideyuki Murata, c/o Japan Advanced Institute of Science and Technology, 1-1, Asahidai, Tatsunokuchimachi, Nomi-gun, Kanazawa (JP) 923-1292

(73) Assignees: Toshiba Matsushita Display Technology Co., Ltd., Tokyo (JP); Hideyuki Murata, Kanazawa-shi (JP)

( * ) Notice: Subject to any disclaimer, the term of this patent is extended or adjusted under 35 U.S.C. 154(b) by 519 days.

(21) Appl. No.: 11/263,951

(22) Filed: Nov. 2, 2005

(65) Prior Publication Data

US 2006/0094321 A1 May 4, 2006

(30) Foreign Application Priority Data

Nov. 4, 2004 (JP) .............................. 2004-320935

(51) Int. Cl.
*H01J 9/44* (2006.01)
(52) U.S. Cl. ...................... 445/6; 445/3; 438/4; 438/22
(58) Field of Classification Search .................... 445/3, 445/6; 438/4, 22, 82, 99; 315/169.1, 169.3
See application file for complete search history.

(56) References Cited

U.S. PATENT DOCUMENTS

2003/0052619 A1 * 3/2003 Huiberts et al. .......... 315/169.3

FOREIGN PATENT DOCUMENTS

JP 4-14794 1/1992

\* cited by examiner

*Primary Examiner*—Joseph L Williams
(74) *Attorney, Agent, or Firm*—Oblon, Spivak, McClelland, Maier & Neustadt, P.C.

(57) ABSTRACT

A method of manufacturing an organic EL element includes applying a reverse bias to an organic EL element with an inverse layered structure until a current density of the organic EL element at an impressed voltage of 10 V reaches 0.075 mA/cm$^2$ or more.

20 Claims, 7 Drawing Sheets

METHOD OF MANUFACTURING ORGANIC EL ELEMENT

CROSS-REFERENCE TO RELATED APPLICATIONS

This application is based upon and claims the benefit of priority from prior Japanese Patent Application No. 2004-320935, filed Nov. 4, 2004, the entire contents of which are incorporated herein by reference.

BACKGROUND OF THE INVENTION

1. Field of the Invention

The present invention relates to a method of manufacturing an organic electroluminescence (EL) element.

2. Description of the Related Art

The structures of organic EL elements can be classified into a normal layered structure and inverse layered structure. In the normal layered structure, an anode, an organic layer including an emitting layer, and a cathode are stacked in this order on a substrate. In the inverse layered structure, these components are stacked in the reverse order. In these organic EL elements, a transparent conductive oxide such as ITO (indium tin oxide) is normally used as the material of the anode, and a metal or alloy is normally used as the material of the cathode.

The structures of the organic EL elements can also be classified into a bottom emission structure and top emission structure. In the bottom emission structure, light emitted by the emitting layer is extracted from the substrate side. In the top emission structure, light emitted by the emitting layer is extracted from the opposite side. Presently, many organic EL elements use the normal layered structure regardless of whether they have the bottom emission structure or top emission structure.

Jpn. Pat. Appln. KOKAI Publication No. 4-14794 describes aging which is performed to stabilize the emission of an organic EL element. In this aging, a forward voltage, a reverse voltage, or a voltage having a waveform obtained by combining these voltages is applied to an organic EL element.

BRIEF SUMMARY OF THE INVENTION

According to a first aspect of the present invention, there is provided a method of manufacturing an organic EL element, comprising applying a reverse bias to an organic EL element with an inverse layered structure until a current density of the organic EL element at an impressed voltage of 10 V reaches 0.075 mA/cm$^2$ or more.

According to a second aspect of the present invention, there is provided a method of manufacturing an organic EL element, comprising applying a reverse bias to an organic EL element with an inverse layered structure until a current density of the organic EL element at an impressed voltage of 10 V reaches or exceed three times as high as that of the organic EL element before application of the reverse bias.

According to a third aspect of the present invention, there is provided a method of manufacturing an organic EL element, comprising applying a reverse voltage to an organic EL element with an inverse layered structure while heating the organic EL element by a heat source disposed outside the organic EL element.

"An organic EL element having an inverse layered structure" means an organic EL element having a structure in which a cathode, emitting layer, and anode are stacked in this order on an underlayer. Also, "a reverse bias is applied to the organic EL element" means that a voltage by which the electric potential of the anode of the organic EL element becomes lower than that of its cathode is applied between the anode and cathode.

DETAILED DESCRIPTION OF THE INVENTION

An embodiment of the present invention will be described in detail below with reference to the accompanying drawing. Note that the same reference numerals denote constituent elements which achieve the same or similar functions in the drawing, and a repetitive explanation thereof will be omitted.

Figure 1:
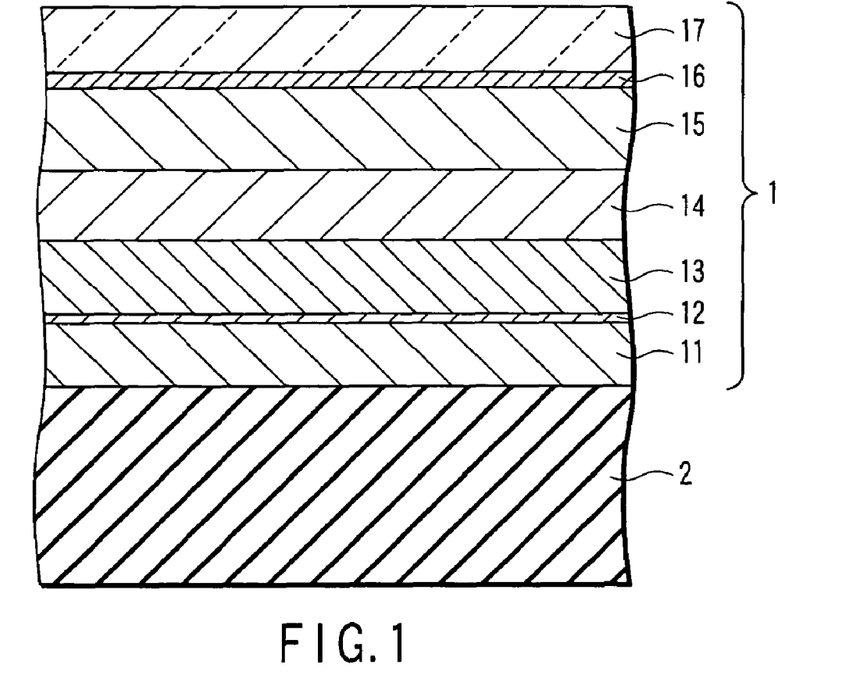
FIG. 1 is a sectional view schematically showing an example of an organic EL element which can be manufactured by a method according to an embodiment of the present invention.

FIG. 1 is a sectional view schematically showing an example of an organic EL element which can be manufactured by a method according to the embodiment of the present invention.

An organic EL element 1 has an inverse layered structure, and is formed on a glass substrate or on an underlayer 2 such as an insulating layer formed on the glass substrate. The organic EL element 1 includes a cathode 11, electron injection layer 12, electron transporting layer 13, emitting layer 14, hole transporting layer 15, hole injection layer 16, and anode 17.

The cathode 11 reflects light and functions as a reflecting layer. As the material of the cathode 11, it is possible to use, e.g., a metal such as aluminum or silver, or an alloy such as an aluminum alloy.

The electron injection layer 12 is an inorganic layer formed between the cathode 11 and emitting layer 14 and in contact with the cathode 11. The material of the electron injection layer 12 is typically a material having electron affinity intermediate between the work function of the cathode 11 and the electron affinity of the emitting layer 14. As the material of the electron injection layer 12, it is possible to use, e.g., an alkali metal compound such as lithium fluoride, or an alkaline-earth compound. The thickness of the electron injection layer 12 is, e.g., about 0.5 to 3 nm.

The electron transporting layer 13 is an organic layer interposed between the electron injection layer 12 and emitting layer 14. The material of the electron transporting layer 13 is typically a material having electron affinity intermediate between the electron affinity of the electron injection layer 12 and that of the emitting layer 14. As the material of the electron transporting layer 13, it is possible to use, e.g., an organometallic complex such as tris(8-hydroxyquinolate) aluminum ($Alq_3$) which is a coordinated complex of aluminum having three oxines as ligands. The thickness of the electron transporting layer 13 is, e.g., about 5 to 50 nm.

The emitting layer 14 is an organic layer which emits light by recombination of electron and hole. The emitting layer 14 may also function as the electron transporting layer 13. As the material of the emitting layer 14, it is possible to use, e.g., a material obtained by adding a dopant as a luminescent center to a host material. The thickness of the emitting layer 14 is, e.g., about 5 to 50 nm.

The hole transporting layer 15 is interposed between the emitting layer 14 and hole injection layer 16. The material of the hole transporting layer 15 is typically a material having ionization energy intermediate between the ionization energy of the emitting layer 14 and that of the hole injection layer 16. As the material of the hole transporting layer 15, it is possible to use, e.g., an organic material such as 4,4'-bis[N-(1-naphthyl)-N-phenyl-amino]biphenyl (αNPD). The thickness of the hole transporting layer 15 is, e.g., about 5 to 200 nm.

The hole injection layer 16 is interposed between the emitting layer 14 and anode 17, and in contact with the anode 17. The material of the hole injection layer 17 is typically a material having ionization energy intermediate between the ionization energy of the emitting layer 14 and the work function of the anode 17. As the material of the hole injection layer 16, copper phthalocyanine (CuPc) or the like can be used. The thickness of the hole injection layer 16 is, e.g., about 3 to 10 nm.

The anode 17 transmits light. As the material of the anode 17, it is possible to use, e.g., a transparent conductive oxide such as ITO.

In this embodiment, the organic EL element 1 can be manufactured by, e.g., the following method. First, the organic EL element 1 is obtained by sequentially forming the cathode 11, electron injection layer 12, electron transporting layer 13, emitting layer 14, hole transporting layer 15, hole injection layer 16, and anode 17 on the underlayer 2. These layers can be formed by using, e.g., vacuum evaporation or sputtering.

Then, aging is performed. That is, a reverse bias is applied between the cathode 11 and anode 17 in an inert gas ambient such as a nitrogen ambient. This makes the injection efficiency of the organic EL element 1 higher than that before aging. Consequently, light having the same luminance as that before aging can be emitted by a driving voltage lower than that before aging.

As will be described in detail later, the present inventors consider that this aging changes the structure between the cathode 11 and emitting layer 14, and as a consequence injection of electrons into the emitting layer 14 readily occurs. In particular, when the organic EL element 1 includes the electron injection layer 12 between the cathode 11 and emitting layer 14, the injection efficiency of electrons can be significantly increased by the aging. That is, in the organic EL element 1 in which the cathode 11, electron injection layer 12, emitting layer 14, and anode 17 are formed in this order, the aging changes the structure between the cathode 11 and emitting layer 14, and this change presumably greatly increases the injection efficiency of electrons.

The aging described above is performed under conditions by which, e.g., the injection efficiency of the organic EL element 1 becomes three times or more the value before the aging.

The reverse bias applied to the organic EL element 1 is, e.g., about 5 V to about 30 V. If the reverse bias is low, the injection efficiency of the organic EL element 1 cannot be increased within a short time period. If the reverse bias is high, the organic EL element 1 may be broken.

The duration of the aging is, e.g., about 30 min to about 24 hrs. If the aging duration is short, the injection efficiency of the organic EL element 1 cannot be well increased. If the aging duration is long, no high productivity can be realized.

The aging may also be performed while the organic EL element 1 is heated by a heat source positioned outside the organic EL element 1. For example, the aging may also be performed while the organic EL element 1 is heated to about 40° C. to 80° C., desirably, about 60° C. In this manner, the injection efficiency of the organic EL element 1 can be increased within a shorter aging duration or by a lower reverse bias.

The organic EL element 1 manufactured by the above method can be used as an emitting element of various apparatuses. For example, the organic EL element 1 can be used as a display element of an organic EL display.

The organic EL display can use one of a bottom emission structure in which light emitted by the organic EL element is extracted from the underlayer side, and a top emission structure in which this light is extracted from the opposite side. In the top emission organic EL display, even when a thin-film transistor (TFT), interconnection, and the like are formed in a position where they overlap the organic EL element in the direction of thickness, they do not intercept light from the organic EL element, unlike in the bottom emission organic EL display. Accordingly, the top emission structure can realize the same luminance as the bottom emission structure by a lower current density.

It is, therefore, possible to realize both low power consumption and a long life when the inverse layered structure is used as the organic EL element in the top emission organic EL display and the above-mentioned aging is performed.

Examples of the present invention will be described below.

(Test 1)

Figure 2:
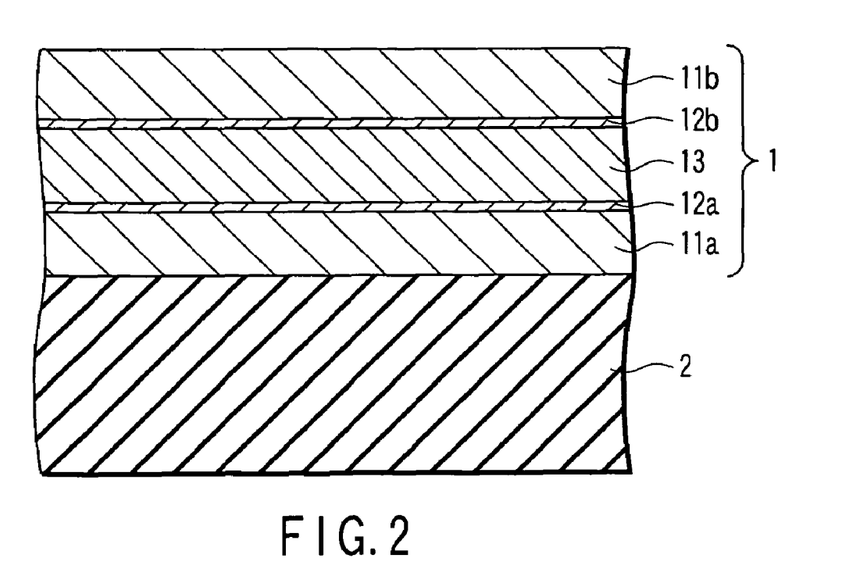
FIG. 2 is a sectional view schematically showing a test element.

FIG. 2 is a sectional view schematically showing a test element. A test element 10 has a structure in which a 100-nm thick Al layer 11a, 1-nm thick LiF layer 12a, 200-nm thick $Alq_3$ layer 13, 1-nm thick LiF layer 12b, and 100-nm thick Al layer 11b are stacked in this order on a glass substrate 2. Note that these layers were formed by vacuum evaporation.

In this example, the current-voltage characteristics of the test element 10 shown in FIG. 2 were measured first. The results are shown in FIG. 3.

Figure 3:
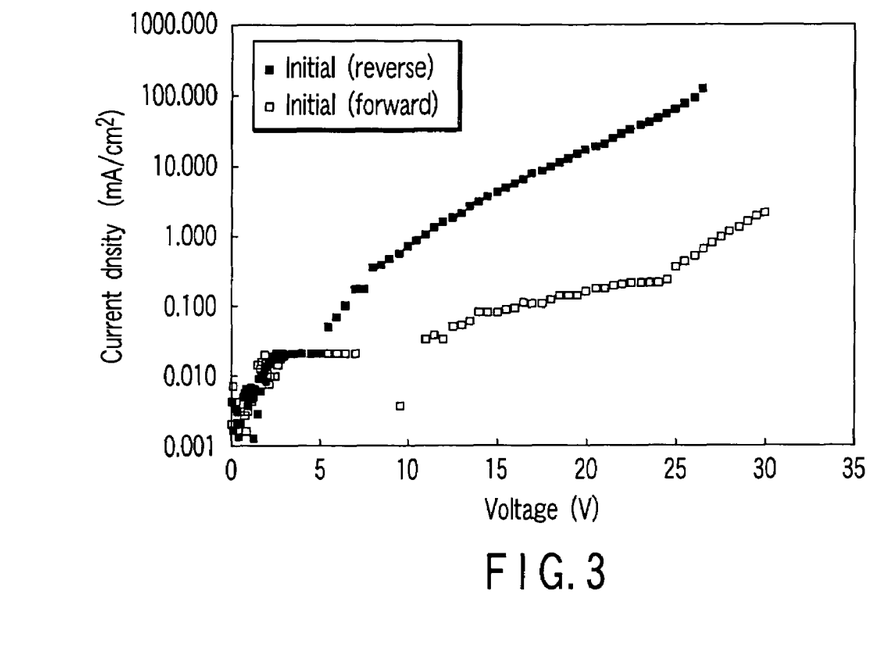
FIG. 3 is a graph showing the current-voltage characteristics of the test element shown in FIG. 2.

FIG. 3 is a graph showing the current-voltage characteristics of the test element shown in FIG. 2. Referring to FIG. 3, the abscissa indicates the voltage applied between the Al layers 11a and 11b, and the ordinate indicates the current density. Also, data represented by "Initial (forward)" was obtained when the voltage was applied such that the electric potential of the Al layer 11a was lower than that of the Al layer 11b, and data represented by "Initial (reverse)" was obtained when the voltage was applied such that the electric potential of the Al layer 11a was higher than that of the Al layer 11b. Note that in this example, the Al layers 11a and 11b are regarded as a cathode and anode, respectively, the current-voltage characteristic when the voltage was so applied that the electric potential of the Al layer 11a was lower than that of the Al layer 11b will be called "forward characteristic", and the current-voltage characteristic when the voltage was so applied that the electric potential of the Al layer 11a was higher than that of the Al layer 11b will be called "reverse characteristic".

As described above, the test element 10 has a layered structure symmetrical with respect to the direction of thickness. Originally, therefore, the forward and reverse characteristics of the test element 10 ought to be equal to each other. In effect, however, as shown in FIG. 3, the forward characteristic was much inferior to the reverse characteristic.

In the test element 10, an electric current flows by using electrons as carriers. Also, the electron affinity of $Alq_3$ is smaller than the work function of Al, and the electron affinity of LiF is intermediate between the work function of Al and the electron affinity of $Alq_3$. Therefore, the difference between the forward and reverse characteristics described above indicates that the electron injection efficiency on the side of the Al layer 11a is lower than that on the side of the Al layer 11b.

From the foregoing, the emission efficiency of an organic EL element having the inverse layered structure is lower than that of an organic EL element having the normal layered structure because the electron injection efficiency of the former is lower than that of the latter. Accordingly, a high emission efficiency can be realized even by an organic EL element having the inverse layered structure if the electron injection efficiency can be increased.

(Test 2)

The test element 10 was then aged at room temperature (25° C.), and the forward and reverse characteristics after aging were measured. In this aging, a DC voltage was applied between the Al layers 11a and 11b so that the electric potential of the former was lower than that of the latter, and the current density was maintained at 30 mA/cm² from the start to the end of aging. The results are shown in FIGS. 4 and 5.

Figure 4:
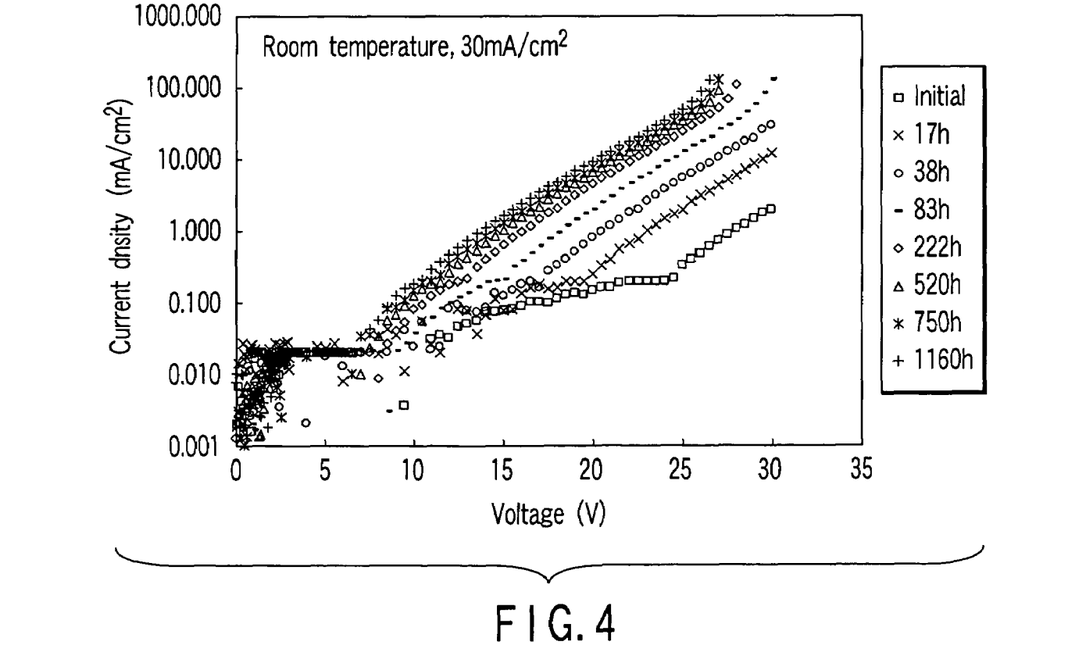
FIG. 4 is a graph showing the relationship between duration of aging and forward characteristic when aging was performed at room temperature by setting the current density at 30 mA/cm$^2$.

FIG. 4 is a graph showing the relationship between the aging duration and forward characteristic when aging was performed at room temperature by setting the current density at 30 mA/cm². FIG. 5 is a graph showing the relationship between the aging duration and reverse characteristic when aging was performed at room temperature by setting the current density at 30 mA/cm².

Figure 5:
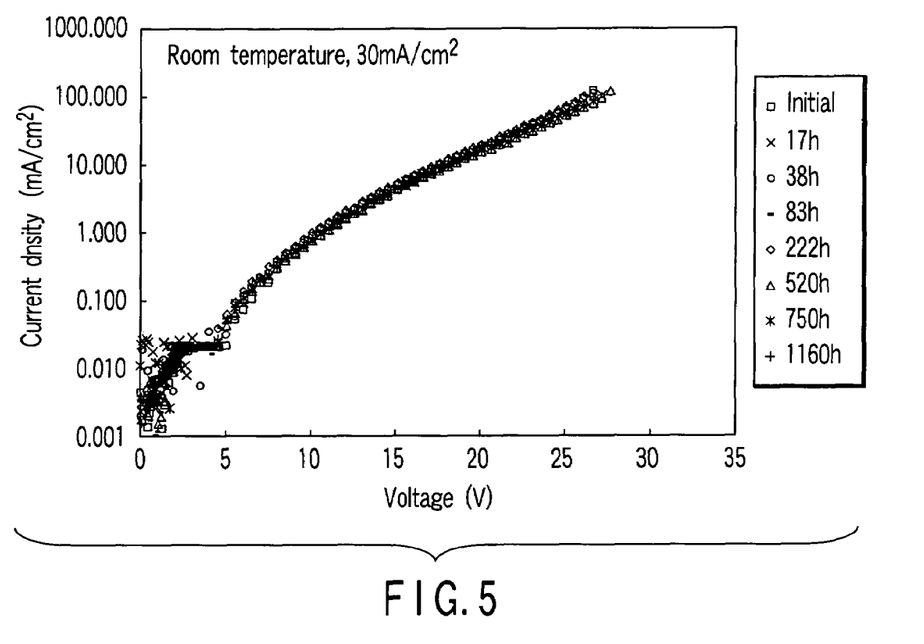
FIG. 5 is a graph showing the relationship between duration of aging and reverse characteristic when aging was performed at room temperature by setting the current density at 30 mA/cm$^2$.

Referring to FIGS. 4 and 5, the abscissa indicates the voltage, and the ordinate indicates the current density. Also, data represented by "Initial" was obtained before aging, and data represented by "17 h", "38 h", "83 h", "222 h", "520 h", "750 h", and "1160 h" was obtained after aging when the aging durations were 17, 38, 83, 222, 520, 750, and 1,160 hrs, respectively.

As shown in FIG. 5, the reverse characteristic scarcely changed before and after aging. In contrast, as shown in FIG. 4, the forward characteristic improved by aging. That is, aging made it possible to improve the electron injection efficiency on the side of the Al layer 11a.

Also, as shown in FIG. 4, the longer the aging duration, the larger the effect of improving the forward characteristic by aging. However, when the aging duration prolonged, the change in forward characteristic with respect to the aging duration decreased.

(Test 3)

Then, a test element 10 identical to that used in test 1 was used to check the influence of the magnitude of an electric current flowing between the Al layers 11a and 11b during a period from the start to the end of aging upon the current-voltage characteristic after aging. The results are shown in FIGS. 6 to 11.

Figure 6:
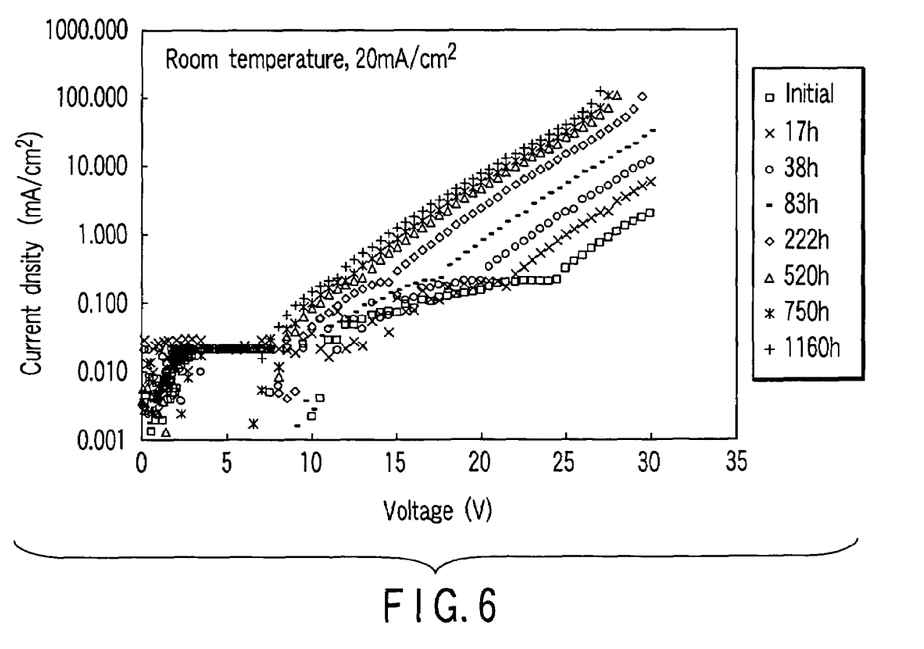
FIG. 6 is a graph showing the relationship between duration of aging and forward characteristic when aging was performed at room temperature by setting the current density at 20 mA/cm$^2$.
Figure 7:
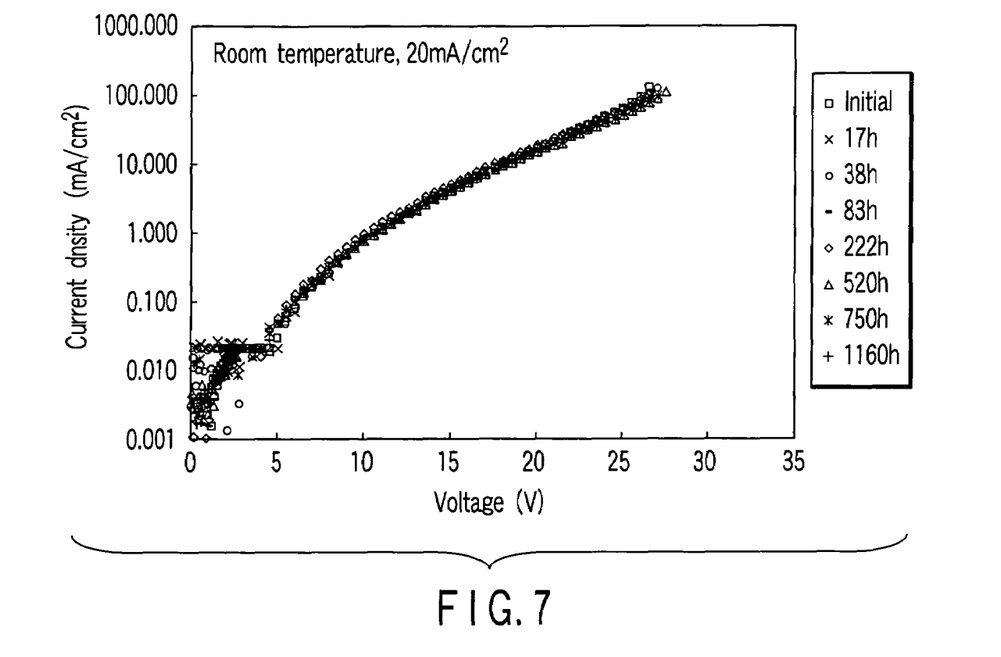
FIG. 7 is a graph showing the relationship between duration of aging and reverse characteristic when aging was performed at room temperature by setting the current density at 20 mA/cm$^2$.
Figure 8:
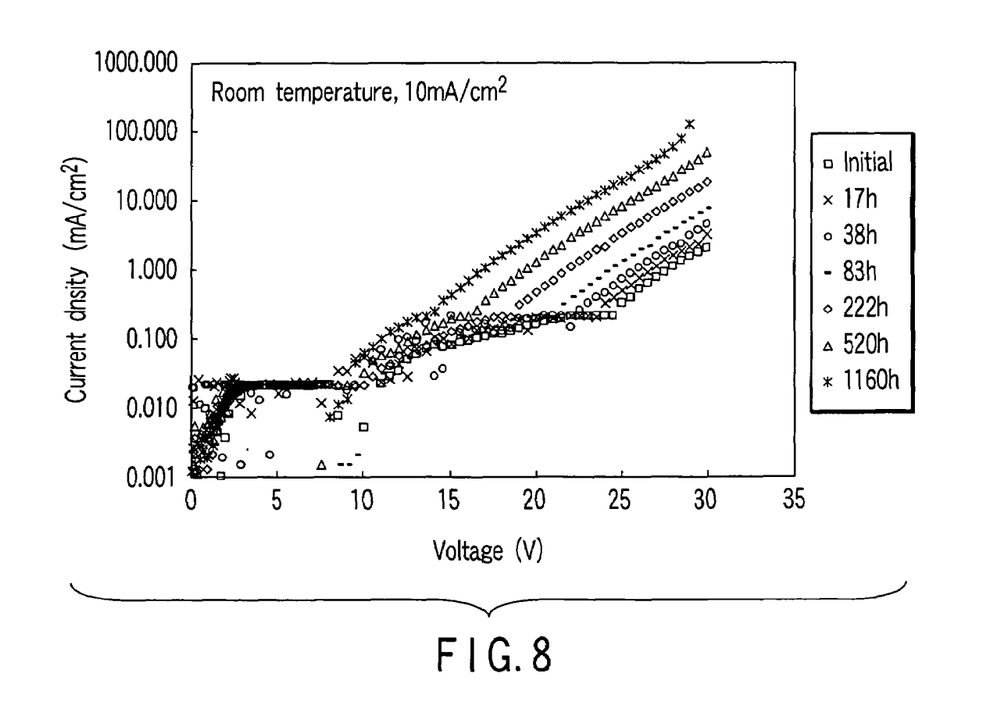
FIG. 8 is a graph showing the relationship between duration of aging and forward characteristic when aging was performed at room temperature by setting the current density at 10 mA/cm$^2$.
Figure 9:
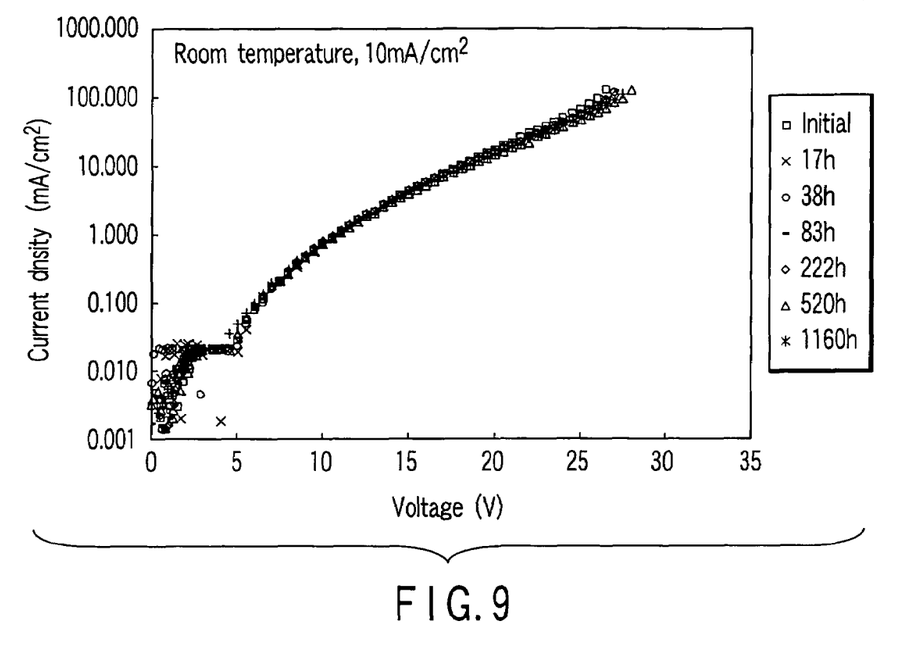
FIG. 9 is a graph showing the relationship between duration of aging and reverse characteristic when aging was performed at room temperature by setting the current density at 10 mA/cm$^2$.
Figure 10:
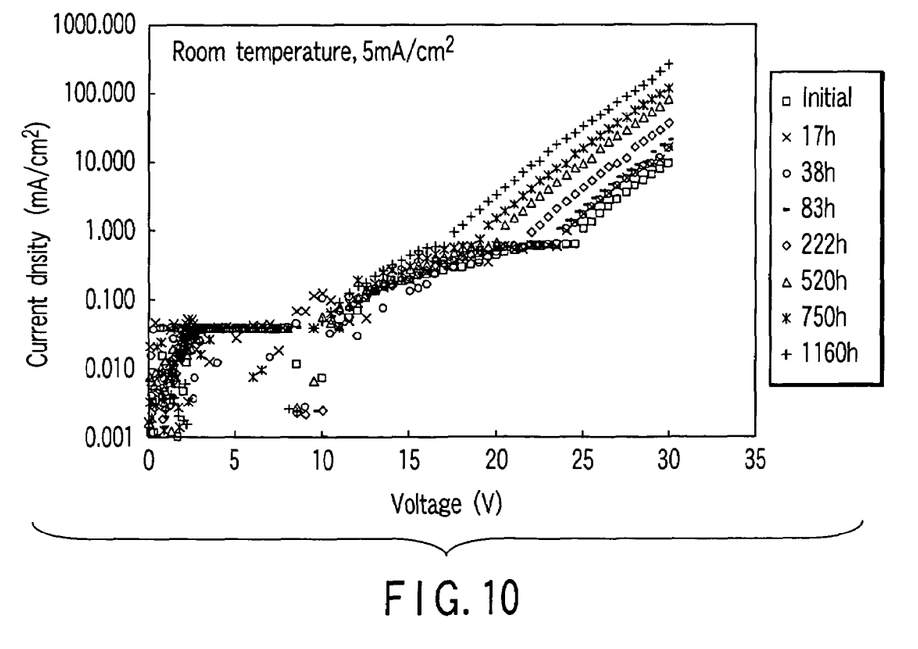
FIG. 10 is a graph showing the relationship between duration of aging and forward characteristic when aging was performed at room temperature by setting the current density at 5 mA/cm$^2$.
Figure 11:
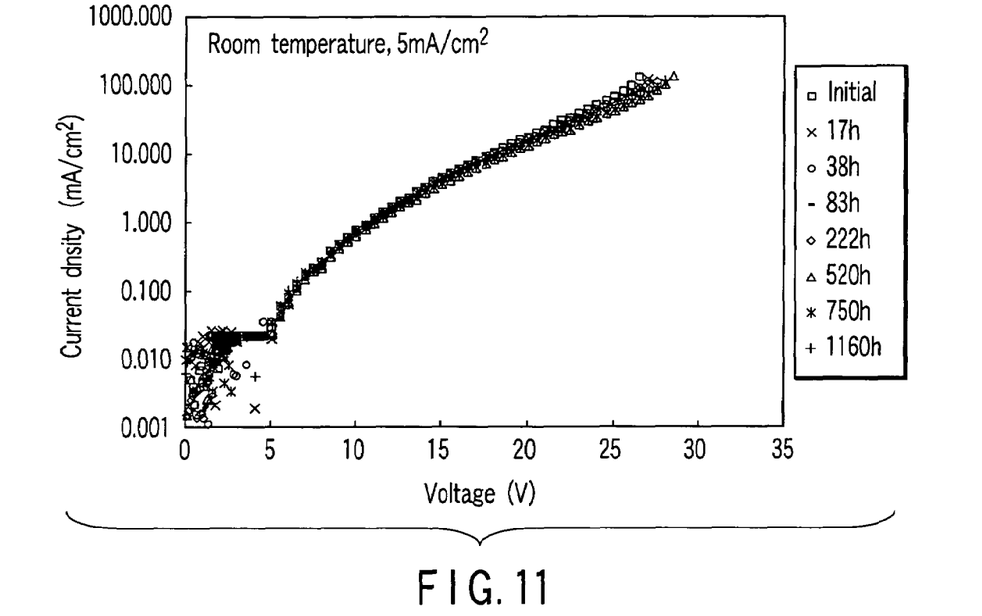
FIG. 11 is a graph showing the relationship between duration of aging and reverse characteristic when aging was performed at room temperature by setting the current density at 5 mA/cm$^2$.

FIG. 6 is a graph showing the relationship between the aging duration and forward characteristic when aging was performed at room temperature by setting the current density at 20 mA/cm². FIG. 7 is a graph showing the relationship between the aging duration and reverse characteristic when aging was performed at room temperature by setting the current density at 20 mA/cm². FIG. 8 is a graph showing the relationship between the aging duration and forward characteristic when aging was performed at room temperature by setting the current density at 10 mA/cm². FIG. 9 is a graph showing the relationship between the aging duration and reverse characteristic when aging was performed at room temperature by setting the current density at 10 mA/cm². FIG. 10 is a graph showing the relationship between the aging duration and forward characteristic when aging was performed at room temperature by setting the current density at 5 mA/cm². FIG. 11 is a graph showing the relationship between the aging duration and reverse characteristic when aging was performed at room temperature by setting the current density at 5 mA/cm².

Referring to FIGS. 6 to 11, the abscissa indicates the voltage, and the ordinate indicates the current density. Also, data represented by "Initial" was obtained before aging, and data represented by "17 h", "38 h", "83 h", "222 h", "520 h", "750 h", and "1160 h" was obtained after aging when the aging durations were 17, 38, 83, 222, 520, 750, and 1,160 hrs, respectively.

As shown in FIGS. 5, 7, 9, and 11, the reverse characteristic scarcely changed before and after aging regardless of the magnitude of the electric current supplied between the Al layers 11a and 11b during the period from the start to the end of aging. In contrast, as shown in FIGS. 4, 6, 8, and 10, the larger the electric current described above, the shorter the time period which is necessary to achieve a certain effect of improving the characteristic.

(Test 4)

A test element 10 identical to that used in test 1 was used to check the influence of the temperature during the aging period upon the forward characteristic after aging. The results are shown in FIGS. 12 and 13.

Figure 12:
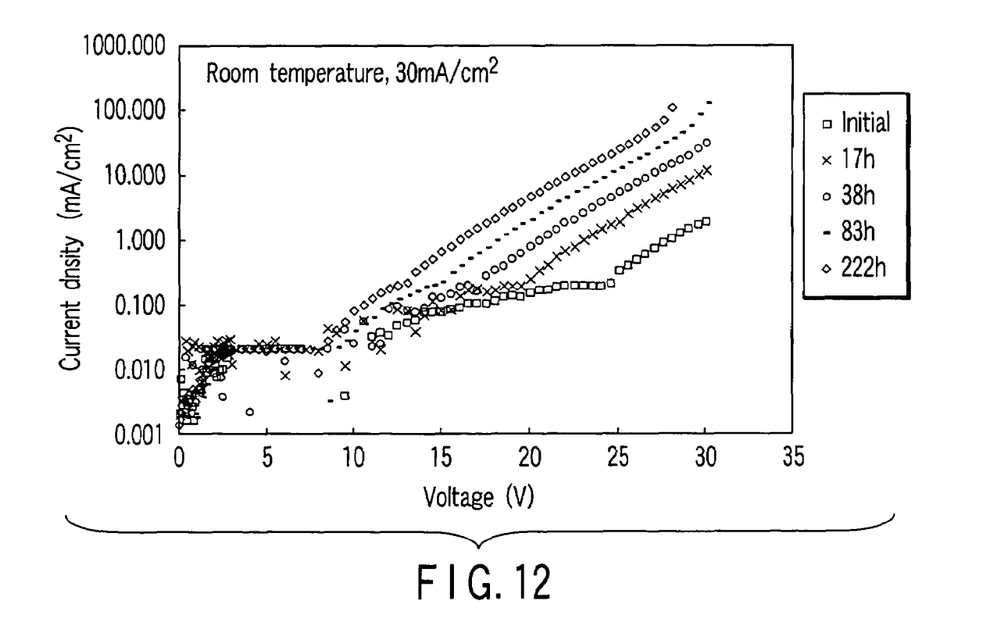
FIG. 12 is a graph showing the relationship between duration of aging and forward characteristic when aging was performed at room temperature by setting the current density at 30 mA/cm$^2$.

FIG. 12 is a graph showing the relationship between the aging duration and forward characteristic when aging was performed at room temperature by setting the current density at 30 mA/cm². FIG. 13 is a graph showing the relationship between the aging duration and forward characteristic when aging was performed by setting the current density at 30 mA/cm² while the test element 10 was heated to 60° C. by using a heater.

Figure 13:
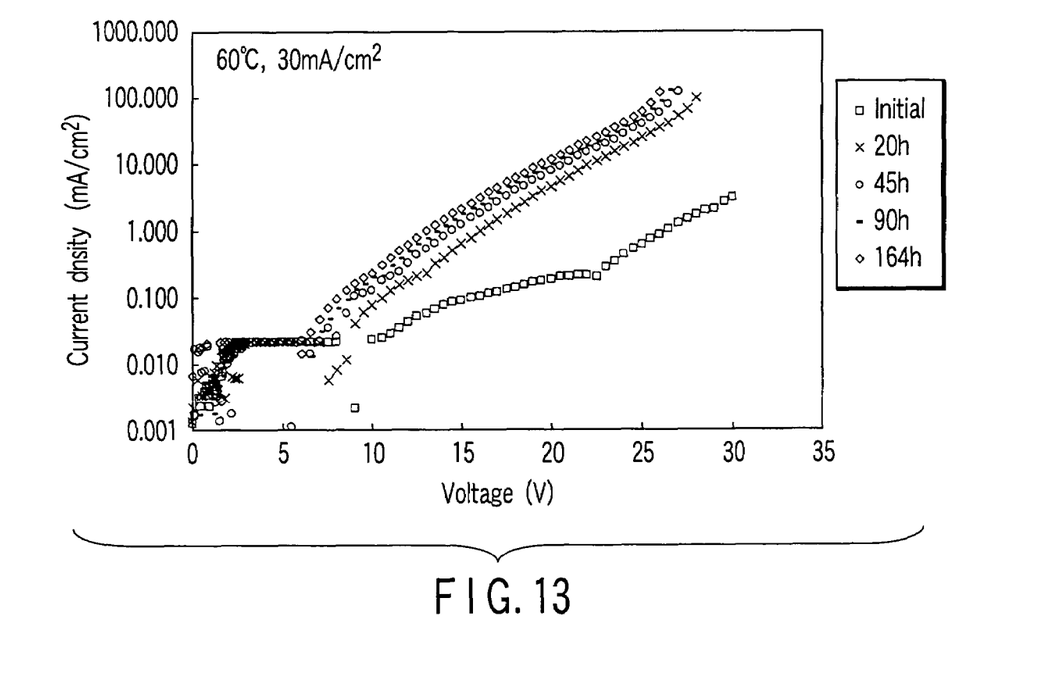
FIG. 13 is a graph showing the relationship between duration of aging and forward characteristic when aging was performed by setting the current density at 30 mA/cm$^2$ while the test element was heated to 60° C. by using a heater.

Referring to FIGS. 12 and 13, the abscissa indicates the voltage, and the ordinate indicates the current density. Also, data represented by "Initial" was obtained before aging, and data represented by "17 h", "20 h", "38 h", "45 h", "83 h", "90 h", "164 h", and "222 h" was obtained after aging when the aging durations were 17, 20, 38, 45, 83, 90, 164, and 222 hrs, respectively.

As can be seen by comparing FIGS. 12 and 13, a time period necessary to achieve a certain effect of improving the characteristic is shorter in the case where aging was performed while heating the test element 10 than in the case where aging was performed without heating the test element 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an organic EL element, comprising applying a reverse bias to an organic EL element with an inverse layered structure until a current density of the organic EL element at an impressed voltage of 10 V reaches 0.075 mA/cm² or more.

2. The method according to claim 1, further comprising forming the organic EL element before application of the reverse bias, wherein forming the organic EL element includes forming a cathode, an emitting layer, and an anode in this order.

3. The method according to claim 2, wherein forming the organic EL element further includes forming an electron injection layer after forming the cathode and before forming the emitting layer.

4. The method according to claim 3, wherein the electron injection layer is a lithium fluoride layer.

5. The method according to claim 3, wherein the electron injection layer is a lithium fluoride layer, and the cathode is an aluminum layer.

6. The method according to claim 1, application of the reverse bias is carried out while heating the organic EL element by a heat source disposed outside the organic EL element.

7. The method according to claim 6, the organic EL element is heated at a temperature from 40° C. to 80° C.

8. A method of manufacturing an organic EL element, comprising applying a reverse bias to an organic EL element with an inverse layered structure until a current density of the organic EL element at an impressed voltage of 10 V reaches or exceed three times as high as that of the organic EL element before application of the reverse bias.

9. The method according to claim 8, further comprising forming the organic EL element before application of the reverse bias, wherein forming the organic EL element includes forming a cathode, an emitting layer, and an anode in this order.

10. The method according to claim 9, wherein forming the organic EL element further includes forming an electron injection layer after forming the cathode and before forming the emitting layer.

11. The method according to claim 10, wherein the electron injection layer is a lithium fluoride layer.

12. The method according to claim 10, wherein the electron injection layer is a lithium fluoride layer, and the cathode is an aluminum layer.

13. The method according to claim 8, application of the reverse bias is carried out while heating the organic EL element by a heat source disposed outside the organic EL element.

14. The method according to claim 13, the organic EL element is heated at a temperature from 40° C. to 80° C.

15. A method of manufacturing an organic EL element, comprising:
    applying a reverse voltage to an organic EL element with an inverse layered structure while heating the organic EL element by a heat source disposed outside the organic EL element.

16. The method according to claim 15, further comprising forming the organic EL element before application of the reverse bias, wherein forming the organic EL element includes forming a cathode, an emitting layer, and an anode in this order.

17. The method according to claim 16, wherein forming the organic EL element further includes forming an electron injection layer after forming the cathode and before forming the emitting layer.

18. The method according to claim 17, wherein the electron injection layer is a lithium fluoride layer.

19. The method according to claim 17, wherein the electron injection layer is a lithium fluoride layer, and the cathode is an aluminum layer.

20. The method according to claim 15, the organic EL element is heated at a temperature from 40° C. to 80° C.

* * * * *